United States Patent [19]

Segawa et al.

[11] Patent Number: 4,504,746

[45] Date of Patent: Mar. 12, 1985

[54] SEMICONDUCTOR BUFFER CIRCUIT USING ENHANCEMENT-MODE, DEPLETION-MODE AND ZERO THRESHOLD MODE TRANSISTORS

[75] Inventors: Makoto Segawa; Shoji Ariizumi, both of Tokyo, Japan

[73] Assignee: Tokyo Shibaura Denki Kabushiki Kaisha, Kawasaki, Japan

[21] Appl. No.: 365,897

[22] Filed: Apr. 6, 1982

[30] Foreign Application Priority Data

Apr. 16, 1981 [JP] Japan .................................. 56-57573

[51] Int. Cl.³ ...................... H03K 19/096; G11C 8/00
[52] U.S. Cl. .................................... 307/475; 307/450; 307/481; 365/230
[58] Field of Search ............... 307/270, 449, 450, 463, 307/475, 279; 365/189, 230, 226, 228, 229

[56] References Cited

U.S. PATENT DOCUMENTS

| 4,103,189 | 7/1978 | Perlegos et al. | 307/463 X |
| 4,161,040 | 7/1979 | Satoh | 307/475 X |
| 4,165,541 | 8/1979 | Varshney et al. | 307/463 X |
| 4,247,921 | 1/1981 | Itoh et al. | 307/475 X |
| 4,296,339 | 10/1981 | Murotani | 307/475 X |
| 4,300,213 | 11/1981 | Tanimura et al. | 307/475 X |
| 4,384,220 | 5/1983 | Segawa et al. | 307/450 |
| 4,408,305 | 10/1983 | Kuo | 307/475 X |

FOREIGN PATENT DOCUMENTS

| 14546 | 2/1978 | Japan | 307/475 |
| 8428 | 1/1979 | Japan | 307/475 |
| 111745 | 9/1979 | Japan | 307/475 |
| 40794 | 3/1982 | Japan | 307/475 |

Primary Examiner—Larry N. Anagnos
Attorney, Agent, or Firm—Finnegan, Henderson, Farabow, Garrett and Dunner

[57] ABSTRACT

An address buffer circuit is provided which has first and second MOS transistors whose current paths are connected in series with each other and whose gates are supplied with input signals of opposite phases, and third and fourth MOS transistors whose current paths are connected in series with each other. The first and third MOS transistors are of I-type. The gate of the third MOS transistor is connected to a junction of the first and second MOS transistors and the gates of the second and fourth MOS transistors are commonly connected. The address buffer circuit further has a MOS transistor which controls the conduction state of the third MOS transistor in response to an external control signal.

10 Claims, 7 Drawing Figures

F I G. 5
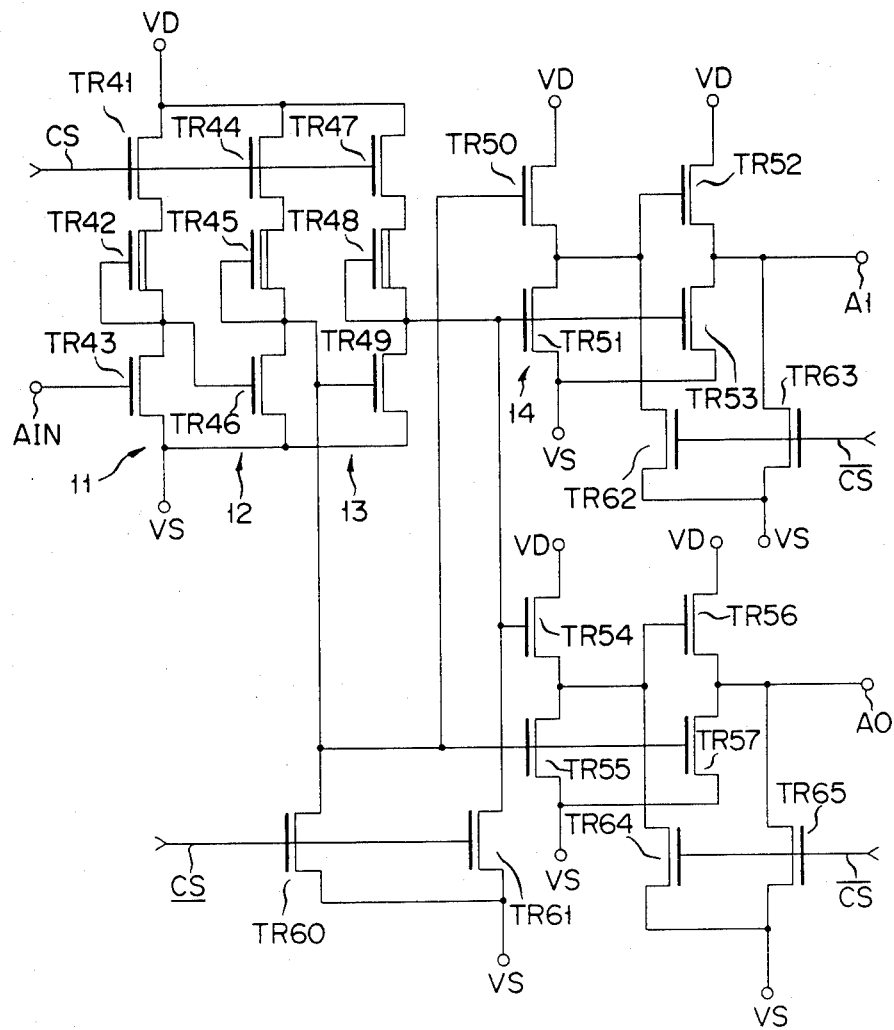

SEMICONDUCTOR BUFFER CIRCUIT USING ENHANCEMENT-MODE, DEPLETION-MODE AND ZERO THRESHOLD MODE TRANSISTORS

BACKGROUND OF THE INVENTION

The present invention relates to a semiconductor circuit including a buffer circuit formed of MOS transistors.

Static memories which are formed of MOS transistors and have capable of operating at high speed are recently been developed. The operating speed of the static memories of this type is becoming almost equivalent to that of a memory formed of bipolar transistors. The operating speed of the static memory of this type is mainly improved by reducing the size of the MOS transistors or changing the circuit design in order to reduce the stray capacitance inherent in the MOS transistors. However, when these measures are taken with the static memories of this type, power consumption increases with higher operating speeds. In order to prevent an increase in power consumption, it is conventionally proposed to use a memory system in which the stand-by mode and the active mode can be selectively set. FIG. 1 shows an example of an address buffer circuit used in the static memory of this type. The buffer circuit shown in FIG. 1 has serially connected inverters 1 to 3 which are respectively formed of MOS transistors TR1 to TR3; TR4 to TR6; and TR7 to TR9, the current paths of which are connected in series between power source terminals VD and VS.

The MOS transistors TR1, TR4 and TR7 are of intrinsic type (I-type) wherein the threshold voltage of each transistor is substantially 0 V. The MOS transistors TR2, TR5 and TR8 are of depletion type (D-type). The MOS transistors TR3, TR6 and TR9 are of enhancement type (E-type).

The junction of the MOS transistors TR2 and TR3 is connected to the gate of the MOS transistor TR6. The junction of the MOS transistors TR5 and TR6 is connected to the gates of the MOS transistors TR9, TR10 and TR11 as well as to the power source terminal VS through an E-type MOS transistor TR12. The junction of the MOS transistors TR8 and TR9 is connected on one hand to the gate of an E-type MOS transistor TR13. The drain of that transistor is connected to the power source terminal VD through the D-type MOS transistor TR10 and the source of which is connected to the power source terminal VS. The junction of TR8 and TR9 is also connected to the gate of a D-type MOS transistor TR14. The drain of TR14 is connected to the power source terminal VD and the source of TR14 is connected to the power source terminal VS through the E-type MOS transistor TR11. The junction of the MOS transistors TR8 and TR9 is also connected to the power source terminal VS through an E-type MOS transistor TR15.

D-type MOS transistors TR16 and TR17 are connected parallel to the MOS transistors TR10 and TR14. The junction of the MOS transistors TR10 and TR13 and the junction of the MOS transistors TR11 and TR14 are respectively connected to output terminals A1 and A0 which are connected to a decoder circuit (not shown) having a great stray capacitance.

With the address buffer circuit shown in FIG. 1 in the stand-by mode, a chip selection signal CS of level "0" is supplied to the gates of the MOS transistors TR1, TR4 and TR7, and a chip selection signal $\overline{CS}$ of level "1" is supplied to the gates of the MOS transistors TR12, TR15, TR16 and TR17. Then, the MOS transistors TR1, TR4, TR7, TR11 and TR13 are rendered nonconductive, and the current paths of the inverters 1, 2 and 3 are cut off. Simultaneously, the output terminals A1 and A0 are respectively pulled up to the VD level through the MOS transistors TR16 and TR17. In this manner, in the stand-by mode, the current hardly flows through the buffer circuit and power consumption is reduced to the minimum.

In the active mode of this address buffer circuit, since the chip selection signals CS and $\overline{CS}$ of levels "1" and "0" are available, the MOS transistors TR1, TR4, and TR7 are rendered conductive. In response to an address input signal AIN applied to the gate of the MOS transistor TR3, address output signals are generated from the address output terminals A1 and A0.

In this address buffer circuit, power consumption in the active mode is reduced to the minimum by adopting a push-pull output circuit. However, since the MOS transistors TR10 and TR14 are of D-type, a considerably great current flows therethrough, resulting in large power consumption.

An address buffer circuit shown in FIG. 2 is basically the same configuration as that shown in FIG. 1 except that the D-type MOS transistors TR16 and TR17 are eliminated, and E-type MOS transistors TR18 and TR19 are respectively connected in parallel to the MOS transistors TR13 and TR11, and MOS transistors TR20 and TR21 are respectively connected between the power source terminal VD and the MOS transistors TR10 and TR14. In the active mode, the MOS transistors TR20 and TR21 are rendered conductive, while the MOS transistors TR18 and TR19 are rendered nonconductive. This address buffer circuit operates in the same manner as that shown in FIG. 1. In the stand-by mode, the MOS transistors TR18 and TR19 are rendered conductive, and the MOS transistors TR20 and TR21 are rendered nonconductive, so that the output terminals A1 and A0 are kept at the VS level. In this address buffer circuit, current flows through the MOS transistors TR10 and TR14 and power consumption increases in the active mode as in the case of the address buffer circuit shown in FIG. 1.

FIG. 3 shows an address buffer circuit in which the power consumption in the active mode is reduced. This address buffer circuit is of similar configuration to that shown in FIG. 2 except that in place of the MOS transistors TR10 and TR20, an I-type MOS transistor is used, the gate of which is connected to the junction of the MOS transistors TR5 and TR6 and the current path of which is connected between the MOS transistor TR13 and the power source terminal VD. Also in place of the MOS transistors TR14 and TR21, an I-type MOS transistor TR23 is used, the gate of which is connected to the junction of the MOS transistors TR8 and TR9 and the current path of which is connected between the MOS transistor TR11 and the power source terminal VD. In the active mode of this address buffer circuit, a gate signal of a phase opposite to that applied to the MOS transistors TR11 and TR22 is applied to the MOS transistors TR13 and TR23. Therefore, the steady state current hardly flows to the output circuit and the power consumption is reduced to the minimum. However, since the mutual conductance of the I-type MOS transistors is smaller than that of the D-type MOS transistors, it is necessary to set, to an extremely great value, a ratio W/L (where W and L indicate the channel width and channel length, respectively, of the I-type MOS transistors) in order to obtain the mutual conductance equivalent to that of the D-type MOS transistors. In order to do so, it is necessary to incorporate the large-sized inverters 1 to 3 for driving the I-type MOS transistors TR22 and TR23. As a consequence, a large current flows to these inverters 1 to 3 and the power consumption may not be suppressed to the minimum.

SUMMARY OF THE INVENTION

It is an object of the present invention to provide a semiconductor circuit which has a buffer circuit which consumes less power, which operates at a high speed, and which is operated in response to a control signal such as a chip selection signal.

According to the present invention, there is provided a semiconductor circuit with a buffer circuit, said buffer circuit including: first and second MOS transistors whose current paths are connected in series with each other, and whose gates are supplied with gate signals of opposite phases, the first MOS transistor having a threshold voltage of substantially 0 V; third and fourth MOS transistors whose current paths are connected in series with each other, and the gate of said third MOS transistor being connected to a junction of the first and second MOS transistors, the third MOS transistor having a threshold voltage of substantially 0 V, and the gate of the fourth MOS transistor being connected to the gate of the second MOS transistor; and a switching circuit which is connected between the gate of the third MOS transistor and a power source terminal and whose conduction state is controlled in response to a control signal.

According to the present invention, since the first and third MOS transistors are of I-type, high speed operation and low power consumption may be simultaneously achieved. At the same time, since the switching circuit is connected between the gate of the third MOS transistor and the power source terminal, the potential at the junction of the third and fourth MOS transistors can be set relatively freely while the switching circuit is operative.

BRIEF DESCRIPTION OF THE DRAWINGS

FIG. 5 is a circuit diagram of an address buffer circuit according to another embodiment of the present invention;

DETAILED DESCRIPTION OF THE PREFERRED EMBODIMENTS

Figure 1:
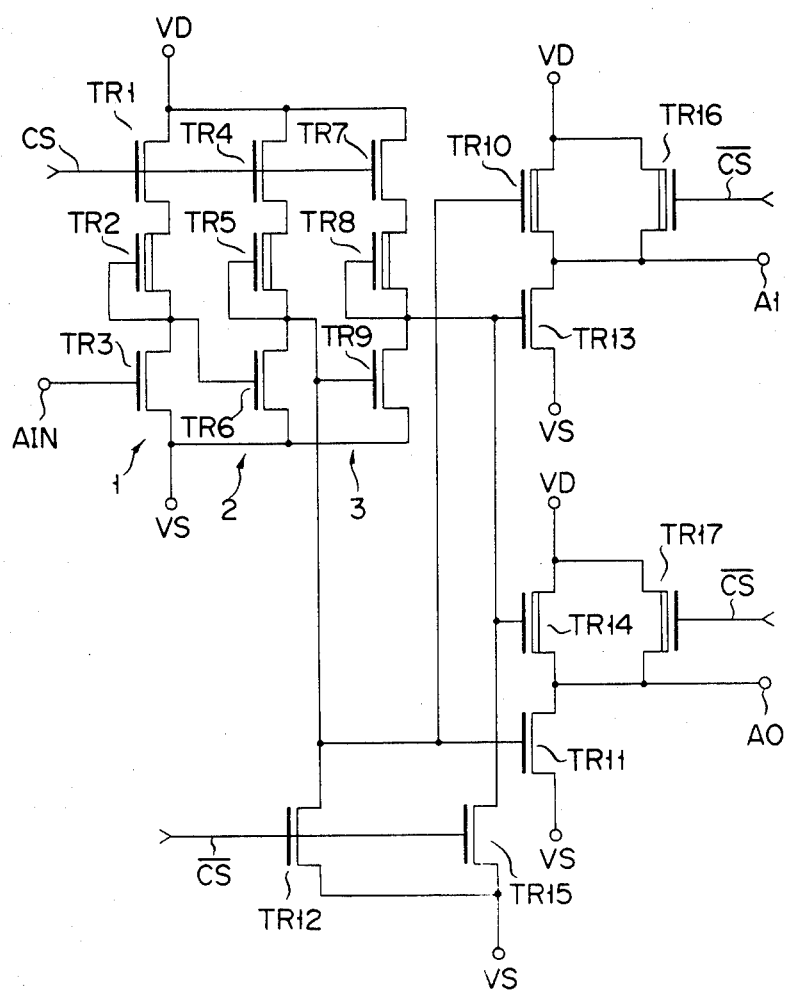
FIGS. 1 and 2 are circuit diagrams of conventional address buffer circuits.
Figure 2:
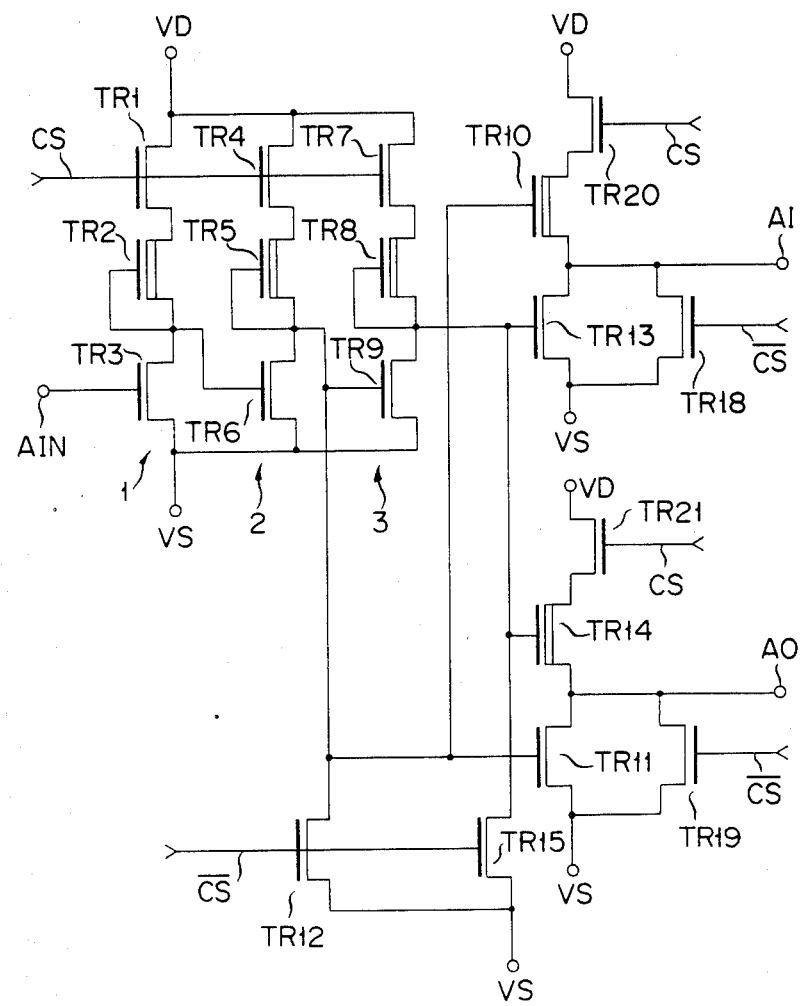

Semiconductor circuits according to the preferred embodiments of the present invention will now be described with reference to the accompanying drawings. The same reference numerals denote the same parts through FIGS. 4 to 7.

Figure 4:
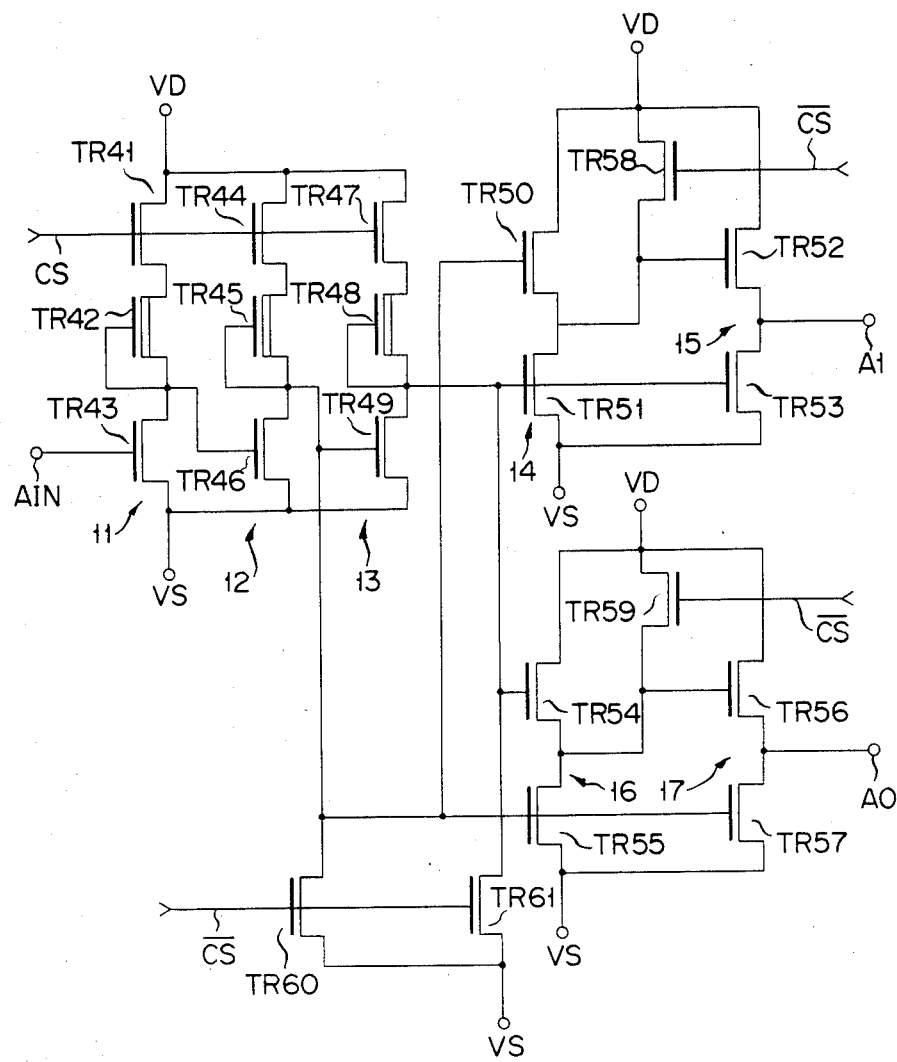
FIG. 4 is a circuit diagram of an address buffer circuit according to an embodiment of the present invention.

An address buffer circuit shown in FIG. 4 has MOS transistors TR41 to TR49 which are connected in the same manner as that of the MOS transistors TR1 to TR9 shown in FIG. 1. More specifically, the MOS transistors TR41, TR44 and TR47 are of I-type. The MOS transistors TR42, TR45 and TR48 are of D-type. The MOS transistors TR43, TR46 and TR49 are of E-type. The MOS transistors TR41 to TR43, TR44 to TR46, and TR47 to TR49 respectively constitute inverters 11, 12 and 13. The address buffer circuit further has four series circuits of MOS transistors, TR50 and TR51, TR52 and TR53, TR54 and TR55, and TR56 and TR57, which are all connected between the power source terminals VD and VS. The address buffer circuit also includes an MOS transistor TR58 which is connected between the gate of the MOS transistor TR52 and the power source terminal VD and a MOS transistor TR59 which is connected between the gate of the MOS transistor TR56 and the power source terminal VD. The MOS transistors TR50, TR52, TR54, TR56, TR58 and TR59 are of I-type, while the MOS transistors TR51, TR53, TR55 and TR57 are of E-type. The MOS transistors TR50, TR52, TR54 and TR56 respectively act as load MOS transistors, while the MOS transistors TR51, TR53, TR55 and TR57 act as driver MOS transistors. The MOS transistors TR50 and TR51, TR52 and TR53, TR54 and TR55, and TR56 and TR57 respectively constitute push-pull type output stage inverters 14, 15, 16 and 17.

The junction of the MOS transistors TR45 and TR46 is connected to the gates of the MOS transistors TR49, TR50, TR55 and TR57 as well as to the power source terminal VS through an E-type MOS transistor TR60. The junction of the MOS transistors TR48 and TR49 is connected to the gates of the MOS transistors TR51, TR53 and TR54 as well as to the power source terminal VS through a MOS transistor TR61. The junction of the MOS transistors TR50 and TR51 is connected to the gate of the MOS transistor TR52 while the junction of the MOS transistors TR54 and TR55 is connected to the gate of the MOS transistor TR56.

When the address buffer circuit shown in FIG. 4 is set in the active mode, the chip selection signal CS of level "1" is supplied to the gates of the I-type MOS transistors TR41, TR44, and TR47 to render these MOS transistors conductive. The chip selection signal $\overline{CS}$ of level "0" is supplied to the gates of the MOS transistors TR58 to TR61 to render these MOS transistors nonconductive. Then, when the address input signal AIN of level "1" is applied to the gate of the MOS transistor TR43, for example, the inverters 12 and 13 respectively generate the output signals of levels "1" and "0", so that the MOS transistors TR50, TR52, TR55 and TR57 are rendered conductive while the MOS transistors TR51, TR53, TR54 and TR56 are rendered nonconductive. Then, the address output signals of levels "1" and "0" are respectively obtained from the output terminals A1 and A0. In this case, since the load MOS transistors TR50, TR52, TR54 and TR56 are of I-type, the steady state current hardly flows to the current paths of the inverters 14 to 17 in the active mode.

Figure 3:
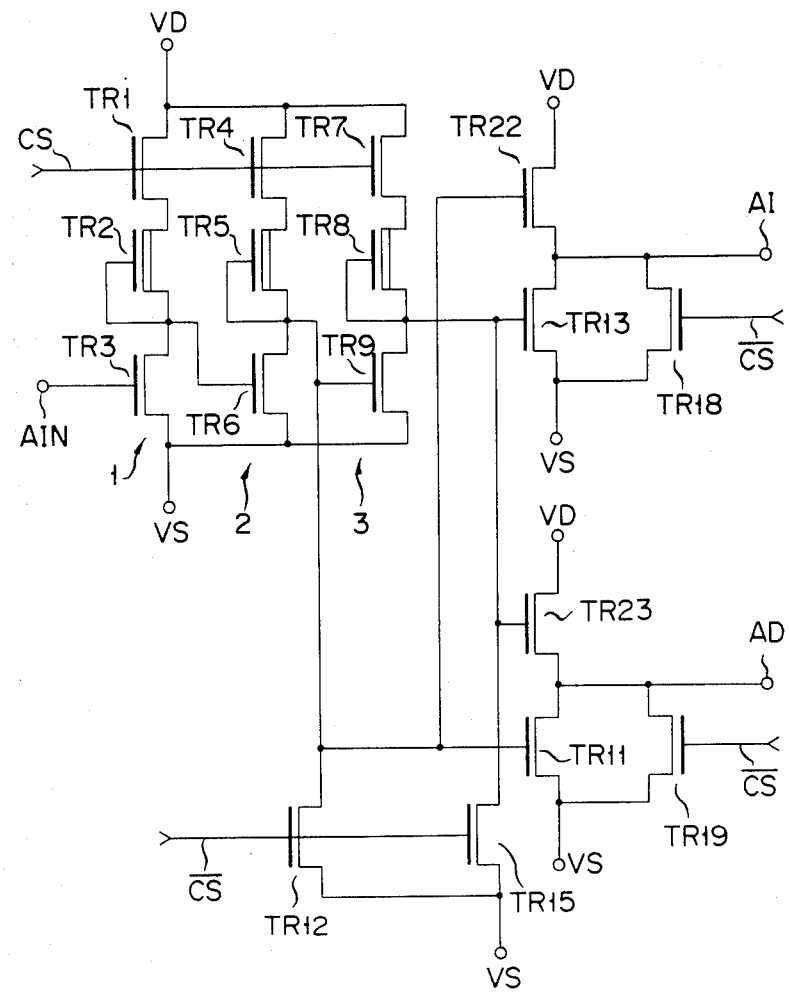
FIG. 3 is a circuit diagram of a conventional address buffer circuit in which power consumption in the active mode can be reduced.

Furthermore, since the load MOS transistors TR50 and TR54 are connected by driving only the MOS transistors TR52 and TR56, the mutual conductance of the MOS transistors TR50 and TR54 need not be made large and the ratio W/L need not be made large. Since the load MOS transistors TR50, TR52, TR54 and TR56 connected to the drive MOS transistors TR51, TR53, TR55 and TR57 are of I-type, the mutual conductance of these drive MOS transistors need only be determined in consideration of the fall time characteristics of the output waveforms without considering the mutual conductance of the load MOS transistors. Then, the ratio W/L of the drive MOS transistors TR51, TR53, TR55 and TR57 can be set to be smaller than that of the load MOS transistors. The ratio W/L of the MOS transistors TR51, TR53, TR55 and TR57 can be set to be sufficiently smaller than that of the MOS transistors TR10, TR11, TR13 and TR14 shown in FIG. 1. Since the I-type MOS transistors of a large ratio W/L need not be directly driven as in the case of the conventional address buffer circuit shown in FIG. 3, the stray capacitances of the inverters 12 and 13 including the MOS transistors TR45 and TR48 are reduced. As a result, the current flowing through the current paths of the inverters 12 and 13 can be suppressed to the minimum.

In the embodiment described above, the steady state current hardly flows to the output stage inverters 15 and 17, and the steady state current flowing through the inverters 11 to 14 and 16 for driving these inverters 15 and 17 can be made small. Therefore, the power consumption of the overall circuit in the active mode can be reduced to the minimum. Since the stray capacitance of the respective inverters is small, high speed operation may be achieved.

Since the I-type MOS transistors have a threshold voltage which is substantially 0 V, the I-type MOS transistors are rendered nonconductive when the source potentials thereof become close to the VD level even if the drain and gate potentials thereof are set at substantially the VD level. Therefore, when the potential at the address output terminal A1 or A0 rises to level "1", the gate potentials of the load MOS transistors TR52 and TR56 at the output stage abruptly rise to high levels by a bootstrap operation since coupling capacitances are present between the gates and sources of the load MOS transistors TR52 and TR56, the load MOS transistors TR50 and TR54 are in the nonconductive state, and the gates of the load MOS transistors TR52 and TR56 are in the floating state. In this manner, the rise time characteristics of the potentials at the address output terminals A1 and A0 can be improved.

When the address buffer circuit shown in FIG. 4 is in the stand-by mode, the MOS transistors TR58 and TR59 are rendered conductive, and the MOS transistors TR51, TR53, TR55 and TR57 are rendered nonconductive. The potentials at the address output terminals A1 and A0 are kept at level "1".

FIG. 5 is a circuit diagram of an address buffer circuit according to another embodiment of the present invention. The address buffer circuit of this embodiment is of similar configuration to that shown in FIG. 4 except that E-type MOS transistors TR62 and TR63 are used in place of the I-type MOS transistor TR58, and E-type MOS transistors TR64 and TR65 are used in place of the I-type MOS transistor TR59. The sources of the MOS transistors TR62 to TR65 are connected to the power source terminal VS. The drains of the MOS transistors TR62 and TR64 are respectively connected to the gates of the MOS transistors TR52 and TR56. The drains of the MOS transistors TR63 and TR65 are respectively connected to the junction of the MOS transistors TR52 and TR53 and to the junction of the MOS transistors TR56 and TR57.

When this address buffer circuit is set in the active mode, the MOS transistors TR62 to TR65 are rendered nonconductive, and the address buffer circuit operates in the same manner as that shown in FIG. 4. When the address buffer circuit shown in FIG. 5 is in the stand-by mode, since the MOS transistors TR62 to TR65 are rendered conductive, the potentials at the address output terminals A1 and A0 are both kept at level "0". The power consumption of this circuit is thus small, and high speed operation may be achieved.

Figure 6:
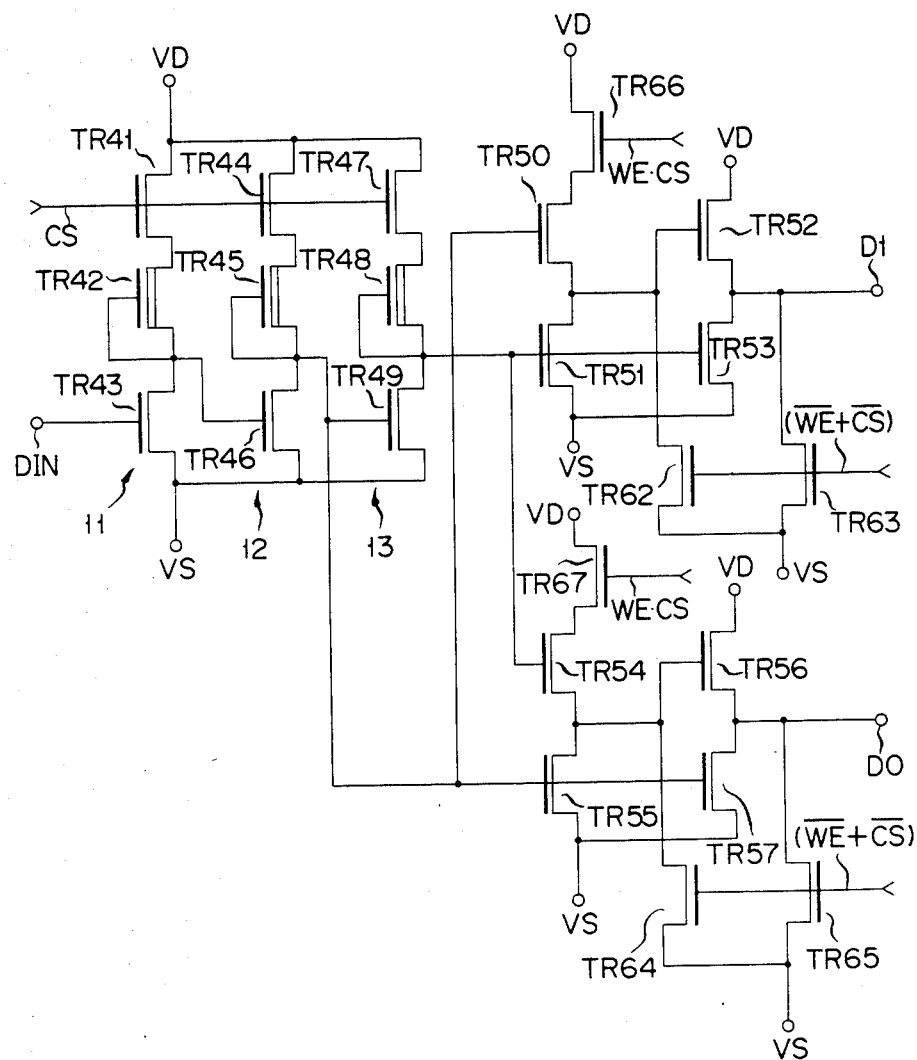
FIG. 6 is a circuit diagram of a data input buffer circuit according to still another embodiment of the present invention.

FIG. 6 shows a data input buffer circuit according to still another embodiment of the present invention. This data input buffer circuit is basically of the same configuration as that shown in FIG. 5 except that a data input signal DIN is supplied to the gate of the MOS transistor TR43 in place of the address input signal AIN, the MOS transistors TR60 and TR61 are eliminated, and I-type MOS transistors TR66 and TR67 are connected between the power source terminal VD and the MOS transistors TR50 and TR54. To the gates of the MOS transistors TR66 and TR67 is supplied an AND signal (WC.CS) of a write enable signal WE and the chip selection signal CS. To the gates of the MOS transistors TR62 to TR65 is supplied an OR signal ($\overline{WE}+\overline{CS}$) of an inverted signal $\overline{WE}$ of the write enable signal WE and an inverted signal $\overline{CS}$ of the chip selection signal CS. The junction of the MOS transistors TR52 and TR53 is connected to a data output terminal D1, while the junction of the MOS transistors TR56 and TR57 is connected to a data output terminal D0.

With a data input buffer circuit of this configuration, in the stand-by mode, the MOS transistors TR41, TR44, TR47, TR66 and TR67 are rendered nonconductive, while the MOS transistors TR62 to TR65 are rendered conductive. In this state, the steady state current does not flow, and the potentials at the output terminals D1 and D0 are kept at level "0".

When the chip selection signal CS and the write enable signal WE are respectively set at levels "1" and "0", the MOS transistors TR66 and TR67 are rendered nonconductive and the MOS transistors TR62 to TR65 are rendered conductive. Thus, the data output terminals D1 and D0 are kept at level "0".

When both the chip selection signal CS and the write enable signal WE are at level "1", the MOS transistors TR62 to TR65 are rendered nonconductive while the MOS transistors TR66 and TR67 are rendered conductive. The data input buffer circuit generates the output signals from the data output terminals D1 and D0 in response to the data input signal DIN.

With this data input buffer circuit, power consumption is small and high speed operation is achieved.

Figure 7:
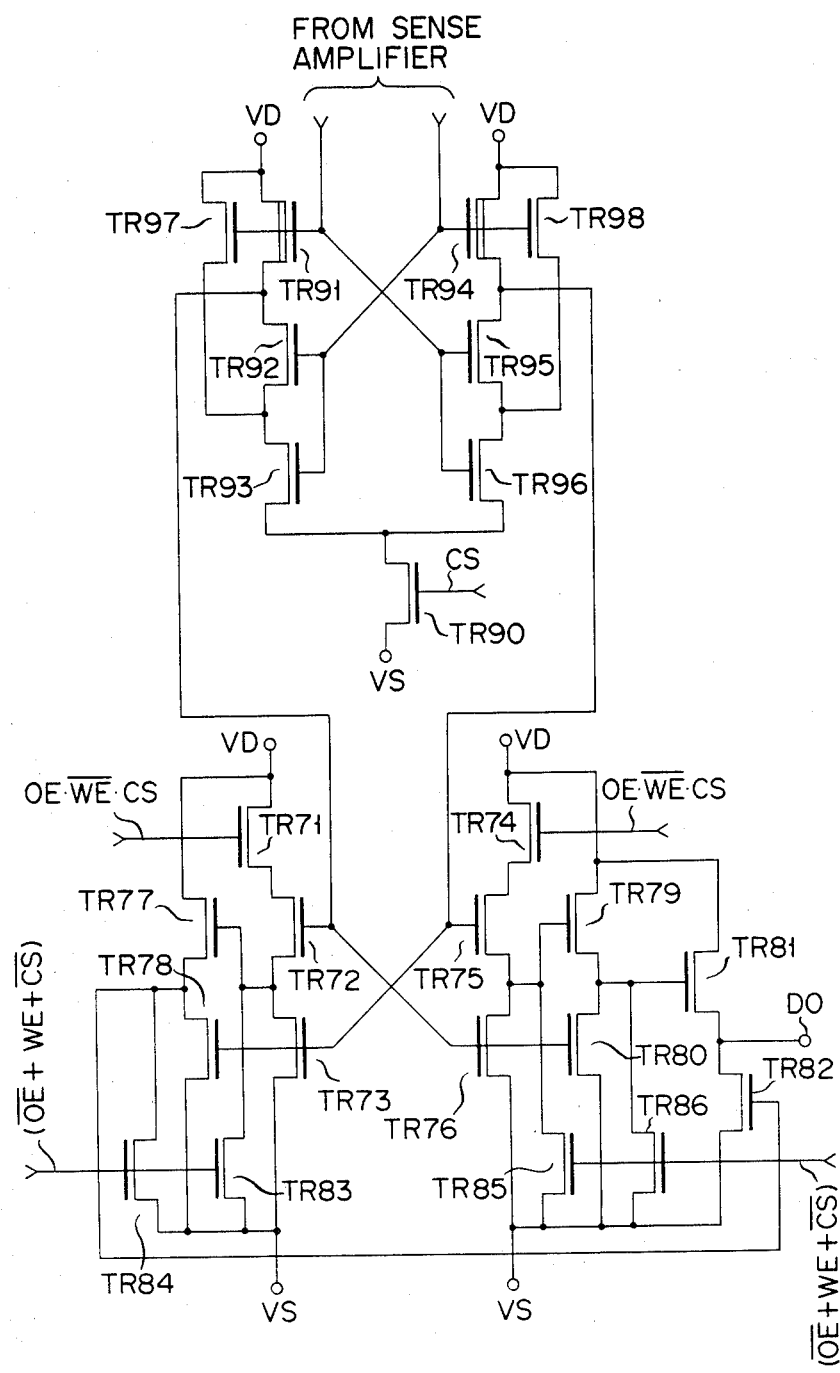
FIG. 7 is a circuit diagram of a data output buffer circuit according to still another embodiment of the present invention.

FIG. 7 is a circuit diagram of a data output circuit according to still another embodiment of the present invention. This data output buffer circuit has series circuits which are respectively formed of MOS transistors TR71 to TR73, TR74 to TR76, TR77 and TR78, TR79 and TR80, and TR81 and TR82 and which are connected between the power source terminals VD and VS. The junction of the MOS transistors TR72 and TR73 is connected to the gate of the MOS transistor TR77 as well as to the power source terminal VS through a MOS transistor TR83. A MOS transistor TR84 is connected in parallel to the MOS transistor TR78. The junction of the MOS transistors TR75 and TR76 is connected to the gate of the MOS transistor TR79 as well as to the power source terminal VS through a MOS transistor TR85. The junction of the MOS transistors TR79 and TR80 is connected to the gate of the MOS transistor TR81 as well as to the power source terminal VS through a MOS transistor TR86.

The data output buffer circuit further has a MOS transistor TR90 whose source is connected to the power source terminal VS; series circuits which are connected between the power source terminals VD and the drain of the MOS transistor TR90 and which are respectively formed of MOS transistors TR91 to TR93, and TR94 to TR96; a MOS transistor TR97 whose drain and source are respectively connected to the junctions between the power source terminal VD and the respective MOS transistors TR92 and TR93; and a MOS transistor TR98 whose drain and source are respectively connected to the junctions between the power source terminal VD and the respective MOS transistors TR95 and TR96.

The junction of the MOS transistors TR91 and TR92 is connected to the gates of the MOS transistors TR72, TR76 and TR80. The junction of the MOS transistors TR94 and TR95 is connected to the gates of the MOS transistors TR73, TR75 and TR78. The gates of the MOS transistors TR92, TR93, TR94 and TR98 are connected to a first output terminal of a sense amplifier (not shown). The gates of the MOS transistors TR91, TR95, TR96 and TR97 are connected to a second output terminal of the same sense amplifier. The data output terminal D0 is connected to the junction of the MOS transistors TR81 and TR82.

In this data output buffer circuit, the MOS transistors TR71, TR72, TR77, TR74, TR75 and TR79 are of I-type, while the MOS transistors TR91 and TR94 are of D-type. The remaining MOS transistors are of E-type.

When the chip selection signal CS is at level "0", the MOS transistors TR71, TR74 and TR90 are rendered nonconductive. Then, the MOS transistors TR77, TR79 and TR81 are rendered nonconductive, and the steady state current does not flow.

When the chip selection signal CS and an output enable signal OE are both at level "1", and the write enable signal WE is at level "0", the MOS transistors TR71, TR74 and TR90 are rendered conductive, and the MOS transistors TR83 to TR86 are rendered nonconductive. In this state, an output signal is obtained from the output terminal D0 in accordance with the output signals from the first and second output terminals of the sense amplifier (not shown). For example, when output signals of levels "0" and "1" are respectively supplied from the first and second output terminals of the sense amplifier, the MOS transistors TR95 and TR96 are rendered conductive. A signal of level "0" is supplied to the gates of the MOS transistors TR73, TR75 and TR78 to render these MOS transistors nonconductive. At the same time, a signal of level "1" is supplied to the MOS transistors TR72, TR76 and TR80 to render these MOS transistors conductive. Signals of level "0" and "1" are respectively applied to the gates of the MOS transistors TR81 and TR77, and a signal of level "0" is obtained from the output terminal D0.

In this embodiment, since the I-type MOS transistors TR71, TR72, TR74, TR75, TR77 and TR79 are used, power consumption is reduced to the minimum and high speed operation is achieved in the active mode.

Although the present invention has been described with reference to particular embodiments thereof, the present invention is not limited to this.

For example, in the embodiment shown in FIG. 4, instead of connecting the drains of the MOS transistors TR58 and TR59 to the power source terminal VD, they may be connected to a power source terminal which supplies a voltage of lower level. Then, in the stand-by mode, it is possible to set the potential level at the output terminals A1 and A0 between 0 level and the VD level.

What we claim is:

1. A semiconductor circuit with a buffer circuit, said buffer circuit including:
   first and second input terminals to which are supplied input signals of opposite phases;
   first and second power source terminals and a control terminal;
   first and second MOS transistor means whose current paths are connected between said second power source terminal and said first and second input terminals;
   third and fourth MOS transistor means whose gates are respectively connected to said first and second input terminals, and whose current paths are connected in series with each other between said first and second power source terminals, said third MOS transistor means having a threshold voltage of substantially 0 V;
   fifth MOS transistor means whose gate is connected to a junction of said third and fourth MOS transistor means, and which has a threshold voltage of substantially 0 V;
   sixth MOS transistor means whose gate is connected to the gate of said fourth MOS transistor means, and whose current path is connected at one end to said second power source terminal and at the other end to said first power source terminal through the current path of said fifth MOS transistor means;
   an output terminal connected to the junction of said fifth and sixth MOS transistor means; and
   switching means connected to said fifth MOS transistor means and whose conduction state is controlled in response to a control signal supplied to said control terminal.

2. A semiconductor circuit according to claim 1, wherein said switching means comprises MOS transistor means whose gate is connected to said control terminal, and whose current path is connected between said first power source terminal and the gate of said fifth MOS transistor means.

3. A semiconductor circuit according to claim 1, wherein said switching means comprises MOS transistor means whose gate is connected to said control terminal, and whose current path is connected to said second power source terminal and the gate of said fifth MOS transistor means.

4. A semiconductor circuit according to claim 3, further comprising MOS transistor means whose current path is connected between said second power source terminal and a junction of said fifth and sixth MOS transistors, and whose gate is connected to said control terminal.

5. A semiconductor circuit with a buffer circuit, said buffer circuit including:
   first and second input terminals to which are supplied gate signals of opposite phases;
   first and second power source terminals and a control terminal;
   first and second MOS transistor means whose current paths are connected in series with each other between said first and second power source terminals and whose gates are respectively connected to said first and second input terminals, said first MOS transistor having a threshold voltage of substantially 0 V;

third MOS transistor means whose gate is connected to receive a first control signal, whose current path is connected between said first MOS transistor means and said first power source terminal, and which has a threshold voltage of substantially 0 V;

fourth MOS transistor means whose gate is connected to a junction of said first and second MOS transistor means and which has a threshold voltage of substantially 0 V;

fifth MOS transistor means whose gate is connected to the gate of said second MOS transistor means and whose current path is connected at one end to said second power source terminal and at the other end to said first power source terminal through the current path of said fourth MOS transistor means;

a first output terminal connected to the junction of said fourth and fifth MOS transistor means; and first switching means connected to the gate of said fourth MOS transistor means and whose conduction state is controlled in response to a second control signal supplied to said control terminal.

6. A semiconductor circuit according to claim 5, wherein said first switching means comprises MOS transistor means whose gate is connected to said control terminal, and whose current path is connected to said second power source terminal and the gate of said fourth MOS transistor means.

7. A semiconductor circuit according to claim 6, further comprising switch MOS transistor means whose current path is connected between said second power source terminal and a junction of said fourth and fifth MOS transistor means, and whose gate is connected to said control terminal.

8. A semiconductor circuit according to claim 5, 6 or 7, further comprising:

sixth and seventh MOS transistor means whose current paths are connected in series with each other between said first and second power source terminals, and whose gates are respectively connected to said second and first input terminals, said sixth MOS transistor means having a threshold voltage of substantially 0 V;

eighth MOS transistor means which is connected between said sixth MOS transistor means and said first power source terminal and which has a threshold voltage of substantially 0 V;

ninth MOS transistor means whose gate is connected to a junction between said sixth and seventh MOS transistor means and which has a threshold voltage of substantially 0 V;

tenth MOS transistor means whose gate is connected to the gate of said seventh MOS transistor means, and whose current path is connected at one end to said second power source terminal and at the other end to said first power source terminal through the current path of said ninth MOS transistor means;

second switching means which is connected to the gate of said ninth MOS transistor means and whose conduction state is controlled in response to a second control signal supplied to said control terminal;

eleventh MOS transistor means whose gate is connected to a junction of said fourth and fifth MOS transistor means;

twelfth MOS transistor means whose gate is connected to a junction of said ninth and tenth MOS transistor means, and whose current path is connected at one end to said second power source terminal and at the other end to said first power source terminal through the current path of said eleventh MOS transistor means; and a second output terminal at the junction of said eleventh and twelfth transistor means.

9. A semiconductor circuit according to claim 8, wherein said second switching means comprises MOS transistor means whose gate is connected to said control terminal, and whose current path is connected to said second power source terminal and the gate of said ninth MOS transistor means.

10. A semiconductor circuit according to claim 9, further comprising MOS transistor whose current path is connected between said second power source terminal and a junction of said ninth and tenth MOS transistor means, and whose gate is connected to said control terminal.

* * * * *